United States Patent
Zhou (10) Patent No.: US 10,176,876 B2
(45) Date of Patent: Jan. 8, 2019

(54) MEMORY CONTROL METHOD AND APPARATUS FOR PROGRAMMING AND ERASING AREAS

(71) Applicants: Semiconductor Manufacturing International (Shanghai) Corporation, Shanghai (CN); Semiconductor Manufacturing International (Beijing) Corporation, Beijing (CN)

(72) Inventor: Shi Cong Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/366,505

(22) Filed: Dec. 1, 2016

(65) Prior Publication Data
US 2017/0154681 A1    Jun. 1, 2017

(30) Foreign Application Priority Data
Dec. 1, 2015    (CN) .......................... 2015 1 0870359

(51) Int. Cl.
*G11C 16/14*    (2006.01)
*G11C 16/26*    (2006.01)
(Continued)

(52) U.S. Cl.
CPC .............. *G11C 16/14* (2013.01); *G11C 16/10* (2013.01); *G11C 16/22* (2013.01); *G11C 16/26* (2013.01); *G11C 16/3436* (2013.01)

(58) Field of Classification Search
CPC ......... G11C 16/14; G11C 16/22; G11C 16/10; G11C 16/26; G11C 16/3436
(Continued)

(56) References Cited

U.S. PATENT DOCUMENTS 6,236,591 B1    5/2001  Pockrandt
2001/0002172 A1*  5/2001  Tanaka ................ G11C 11/5621
                                                    365/185.22
(Continued)

FOREIGN PATENT DOCUMENTS

EP    0398545 A1    11/1990
EP    0562669 A1    9/1993
(Continued)

*Primary Examiner* — Richard Elms
*Assistant Examiner* — Jerome Leboeuf
(74) *Attorney, Agent, or Firm* — Anova Law Group, PLLC (57) ABSTRACT

A memory control method includes providing a memory including a first area and a second area, and reading data in the first area and the second area when receiving data to be stored. The method also includes selecting, from the first area and the second area, an area in which the data is in an erased state. In addition, the method includes performing a programming operation on each memory cell in the selected area to write the data to be stored into the selected area. Further, the method includes—performing an erase operation on a remaining area in the first area and the second area to perform a next data writing process, after writing the data to be stored into the selected area.

20 Claims, 5 Drawing Sheets

(51) Int. Cl.
  *G11C 16/34*    (2006.01)
  *G11C 16/10*    (2006.01)
  *G11C 16/22*    (2006.01)

(58) Field of Classification Search
  USPC ..................................... 365/185.22, 185.29
  See application file for complete search history.

(56) References Cited

U.S. PATENT DOCUMENTS

| | | | |
|---|---|---|---|
| 2011/0044102 A1* | 2/2011 | Dong ................ | G11C 11/5628 365/185.03 |
| 2011/0080785 A1* | 4/2011 | Kim ................... | G11C 11/5621 365/185.03 |
| 2015/0186270 A1* | 7/2015 | Peng ................... | G11C 16/16 711/3 |
| 2016/0011806 A1* | 1/2016 | Zaltsman ............. | G06F 3/0619 711/166 |

FOREIGN PATENT DOCUMENTS

| | | | |
|---|---|---|---|
| EP | 1607867 | A1 | 12/2005 |
| EP | 1988549 | A1 | 11/2008 |
| FR | 2742893 | A1 | 6/1997 |

\* cited by examiner

MEMORY CONTROL METHOD AND APPARATUS FOR PROGRAMMING AND ERASING AREAS

CROSS-REFERENCES TO RELATED APPLICATIONS

This application claims the priority of Chinese patent application No. 201510870359.9, filed on Dec. 1, 2015, the entirety of which is incorporated herein by reference.

FIELD OF THE INVENTION

The present invention generally relates to the field of memory technology and, more particularly, relates to a memory control method and apparatus.

BACKGROUND

Electrically erasable programmable read-only memory (EFPROM) is a memory chip that does not lose data after power-down. In practical applications, when writing data into the EFPROM, the length of page data register limits the length of data to be written each time. Therefore, if the length of the data to be stored exceeds the length of the page data register, in other words, if the length of the data to be stored is more than one page, multiple write operations are needed to complete the storage of all the data.

Figure 1:
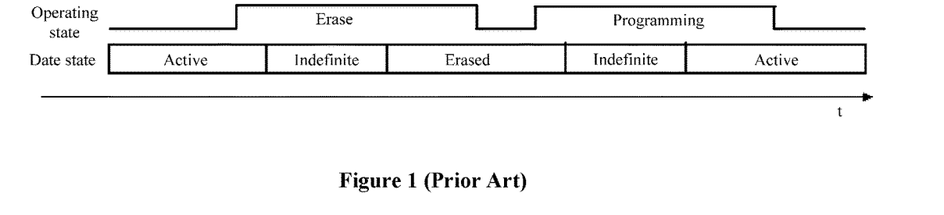
FIG. 1 illustrates an existing schematic diagram of writing data into a memory.

During each write operation, an erase operation is usually first performed on a target memory area, and then a programming operation is performed on the erased target memory area, thus the page data writing is completed. Specifically, as shown in FIG. 1, when erasing the target memory area, the data state in the target memory area is first changed from an active state to an indefinite state, and then from the indefinite state to an erased state, thus the erase operation is completed. When programming the target memory area, the data state in the target memory area is first changed from the erased state to the indefinite state, and then from the indefinite state to the active state, thus the programming operation is completed. After updating the target memory area, a new address is used as the target memory area, and the above-described operations are repeated to update the data in another target memory area.

However, during the data writing process, if the write operation is interrupted while the data state in the target memory area is in the indefinite state or the erased state, it can cause the occurrence of data loss. To avoid the occurrence of the data loss, currently a backup storage method is usually used to store the data. In other words, the same data to be written can be sequentially written into the target memory area and the backup memory area respectively, and at least one data state in the target memory area and the backup memory area is in the active state at any time. For the same data to be written, the erase and programming operations are first performed on the target memory area, and then the erase and programming operations are performed on the backup memory area, to ensure at least one data state in the target memory area and the backup memory area is in the active state at any time.

During the above-described process of storing the data, when the data is N pages in length, the erase operation and the programming operation need to be respectively performed 2N times to complete the storage of all the data. Too many erase and write operations and too long-time erase and write operations can shorten the service life of the EEPROM, and reduce the speed of writing data into the memory. The disclosed device structures and methods are directed to solve one or more problems set forth above and other problems.

BRIEF SUMMARY OF THE DISCLOSURE

One aspect of the present disclosure includes a memory control method. The method includes providing a memory including a first area and a second area, and reading data in the first area and the second area when receiving data to be stored. The method also includes selecting, from the first area and the second area, an area in which the data is in an erased state. In addition, the method includes performing a programming operation on each memory cell in the selected area to write the data to be stored into the selected area. Further, the method includes performing an erase operation on a remaining area in the first area and the second area to perform a next data writing process, after writing the data to be stored into the selected area.

Another aspect of the present disclosure includes a memory control apparatus. The memory control apparatus includes a memory including a first area and a second area. The memory control apparatus also includes a reading cell, configured to read data in the first area and the second area of the memory when receiving data to be stored. In addition, the memory control apparatus includes a selecting cell, configured to select, from the first area and the second area, an area in which the data is in an erased state. Moreover, the memory control apparatus includes a programming cell, configured to perform a programming operation on each memory cell in the selected area to write the data to be stored into the selected area. Further, the memory control apparatus includes an erasing cell, configured to perform an erase operation on a remaining area to perform a next data writing process, after writing the data to be stored into the selected area.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or the like parts.

Figure 2:
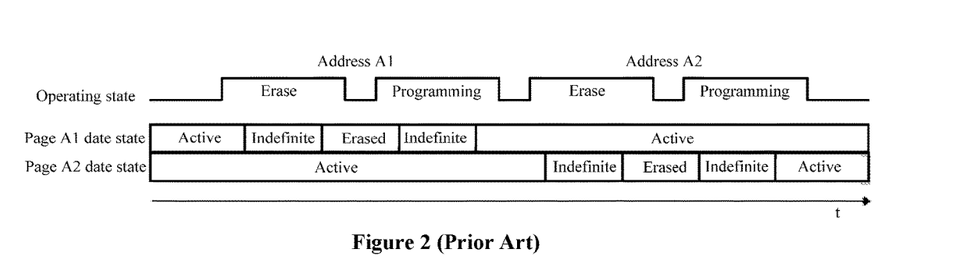
FIG. 2 illustrates another existing schematic diagram of writing data into a memory.

Referring to FIG. 2, when data to be stored is single-page data, the data in the target memory area is the same as the data in the backup memory area at the initial state. When writing data into the memory, an erase operation is first performed on the target memory area, such that the data state in the target memory area is first changed from an active state to an indefinite state, and then from the indefinite state to an erased state. After erasing the data, the data to be stored is written into the target memory area. The data state in the backup memory area is always in the active state from the time when the erase operation is performed on the target memory area to the time when the data to be stored is written into the target memory area. Therefore, it can be ensured that when writing the data to be stored into the target memory area, the original data in the target memory area is not lost whenever the operation is interrupted.

After writing the data to be stored into the target memory area, the erase operation is first performed on the backup memory area, and then new data is written into the backup memory area. At this time, the data state in the target memory area is always in the active state. Therefore, it can be ensured that when writing the data to be stored into the backup memory area, the data to be stored written into the target memory area is not lost whenever the operation is interrupted.

Figure 3:
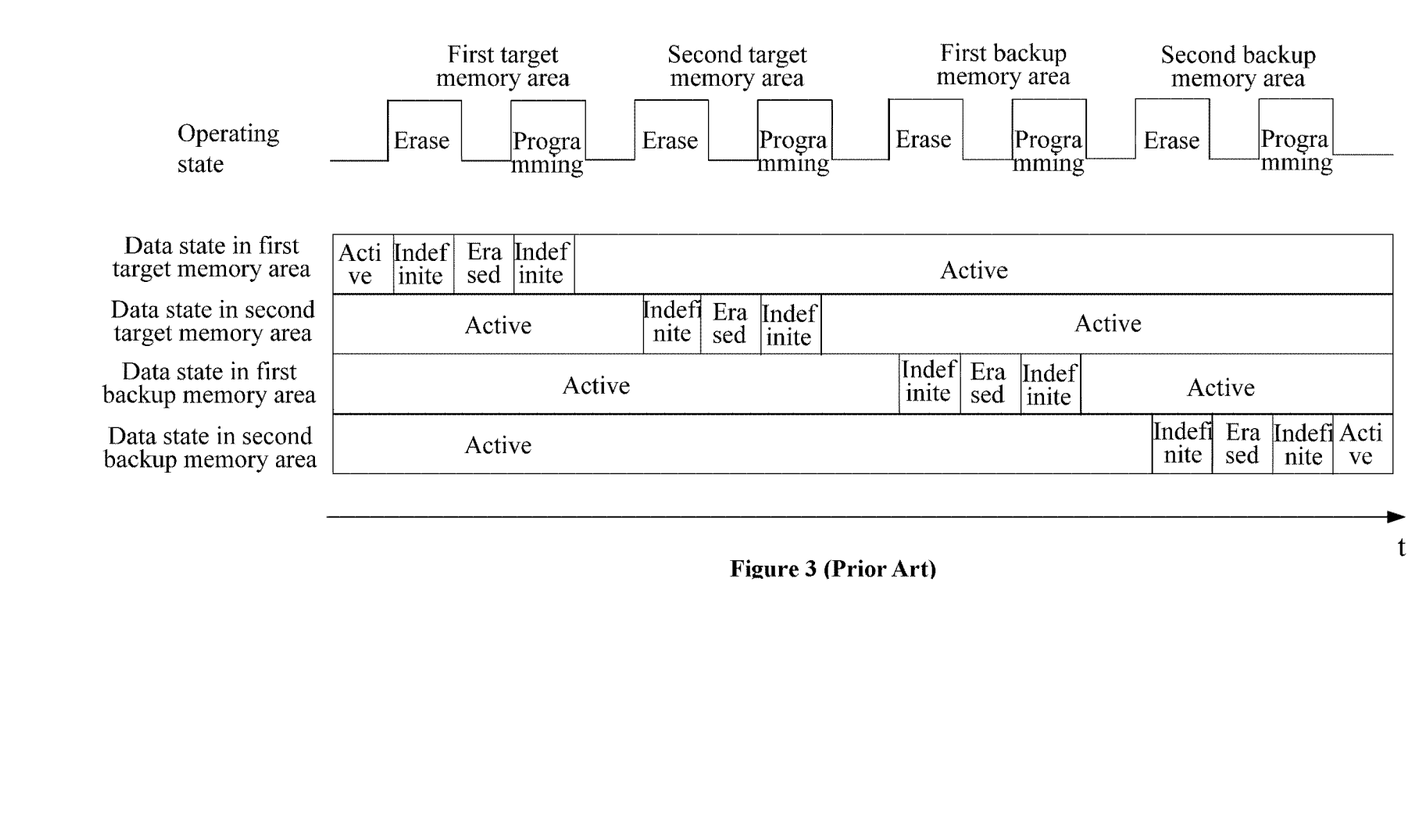
FIG. 3 illustrates other existing schematic diagram of writing data into a memory.

Referring to FIG. 3, when the data to be stored is two-page data, the target memory area includes a first target memory area and a second target memory area, and the backup memory area includes a first backup memory area and a second backup memory area. Specifically, the erase operation is first performed on the first target memory area, and then a programming operation is performed on the first target memory area to write one page data of the data to be stored. Next, the erase operation is performed on the second target memory area, and then the programming operation is performed on the second target memory area. After writing the data into the target memory area, referring to the process of writing the data into the target memory area, the data is sequentially written into the first backup memory area corresponding to the first target memory area and the second backup memory area corresponding to the second target memory area. During the above-described data writing process, the data state in the target memory area or the backup memory area is in the active state at any time. In other words, at any time, the data state in the first target memory area and the second target memory area is in the active state, or the data state in the first backup memory area and the second backup memory area is in the active state. Therefore, at least one active data is retained in the memory whenever the above-described operation is interrupted to achieve secure data write.

Referring to FIG. 2 and FIG. 3, when writing data into the memory by the above-described method, although the secure data write can be achieved, the erase operation and the programming operation need to be respectively performed two times to write per-page data. When the data to be stored is N pages in length, the erase operation and the programming operation need to be respectively performed 2N times, thus causing too many erase and write operations on the memory, impacting the service life of the EEPROM, and reducing the speed of writing data into the memory.

Figure 4:
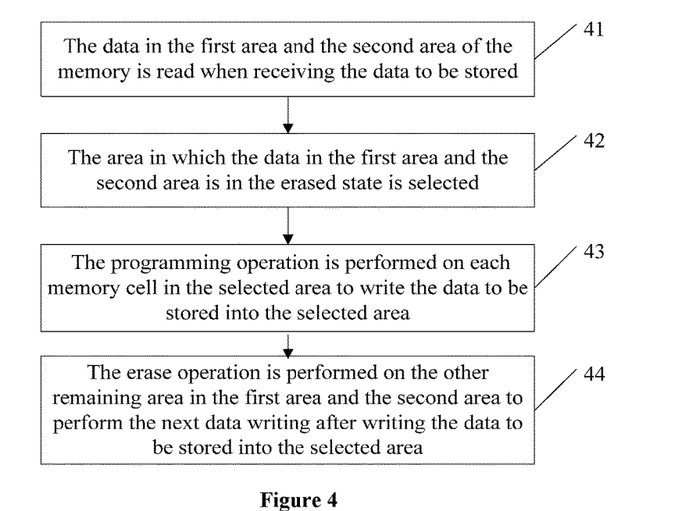
FIG. 4 illustrates an exemplary memory control method consistent with the disclosed embodiments.

The present disclosure provides a memory control method. FIG. 4 illustrates an exemplary memory control method consistent with the disclosed embodiments.

In one embodiment, the memory may include a first area and a second area. The first area and the second area may have the same memory space, and each may include two or more memory cells. The length of the data that can be stored in each memory cell may be one page. The data to be stored may occupy at least two memory cells. The memory space of the first area and the second area may be larger than or equal to the memory space occupied by the data to be stored.

Referring to FIG. 4, in Step 41 of the control method, the data in the first area and the second area of the memory may be read when receiving the data to be stored. Specifically, the data to be stored may include not only the data itself, but also the identification information and the verification information of the data to be stored.

In one embodiment, when writing data into the memory, the length of the data to be written each time may be limited by the length of the page data register, such that the length of the data to be written each time cannot exceed one page. When the length of the data to be stored is more than one page, multiple write operations may be needed to complete the storage of all the data. In other words, the data to be stored may include a plurality of pieces of the data to be written, and the length of each piece of the data to be written may be less than or equal to one page.

In one embodiment, the identification information may be in the form of a serial number, and the write sequence of the data to be stored may be identified based on the identification information. The identification information of each piece of the data to be written may be same or different. When the identification information of each piece of the data to be written is the same, the area in which the data is located can be distinguished based on the identification information. When the identification information of each piece of the data to be written is different, not only the area in which the data is located, but also the specific position of the data located in the area can be distinguished from one another based on the identification information.

In one embodiment, the integrity of the data may be verified based on the verification information. Because the data to be stored may include a plurality of pieces of the data to be written, the verification information of each piece of the data to be written may be same or different. The verification information may be configured to verify whether the read data is complete or not, such that the data state in the memory cell can be determined based on the verification result. When using the verification information to verify whether the read data is complete or not, a parity verification or the alike methods may be used to verify.

In one embodiment, the memory may be a device capable of saving data, and the data can be read and written through the device. For example, the memory may be an electrically erasable programmable read-only memory (EEPROM). The memory may be a stand-alone memory device, or may provide other services at the same time. For example, the memory may open a dedicated data memory area on other devices to provide data storage services. Of course, regardless of types of memory, all memories can be used to read and write data.

In Step 42 of the control method in FIG. 4, the area in which the data in the first area and the second area is in the erased state may be selected. By reading the data in the first area and the second area, the data state in these two areas can be known.

For example, the data state in the memory cell may include the erased state, the indefinite state, and the active state. Among them, the erased state may be that the data in the memory cell may have been erased, and new data can be directly written at this time. The indefinite state may be that the data in the memory cell may be incomplete caused by an interruption of the erase operation performed on the memory cell or by an interruption of the programming operation performed on the memory cell, and new data cannot be directly written at this time. The active state may be that the data in the memory cell may be complete, and the data in the memory cell can be directly read at this time.

The data state in the area can be determined based on the data state in each memory cell in each area. Specifically, when all the data in each memory cell in each area is in the active state, the data in the area may be in the active state. When all the data in each memory cell in each area is in the erased state, the data in the area may be in the erased state. When the states of the data in each memory cell in the area are different, the data in the area may be in the indefinite state.

In one embodiment, when determining the data state in each memory cell, if the data can be read from the memory cell, the data state in the memory cell may be either the active state or the indefinite state. If the data cannot be read from the memory cell, the data state in the memory cell may be the erased state. When the data is read from the memory cell, the state of the read data can be determined by verifying the read data.

When the memory does not include an area in which the data is in the erased state, and includes an area in which the data is in the indefinite state, the erase operation may be performed on the area in which the data is in the indefinite state to change the area in which the data is in the indefinite state to the area in which the data is in the erased state. For example, when the first area is the area in which the data is in the erased state and the second area is the area in which the data is in the indefinite state, the erase operation may be performed on the second area to change the second area to the area in which the data is in the erased state.

In Step 43 of the control method in FIG. 4, the programming operation may be performed on each memory cell in the selected area to write the data to be stored into the selected area.

In Step 44 of the control method in FIG. 4, after writing the data to be stored into the selected area, the erase operation may be performed on other remaining area in the first area and the second area to perform the next data writing process.

Figure 5:
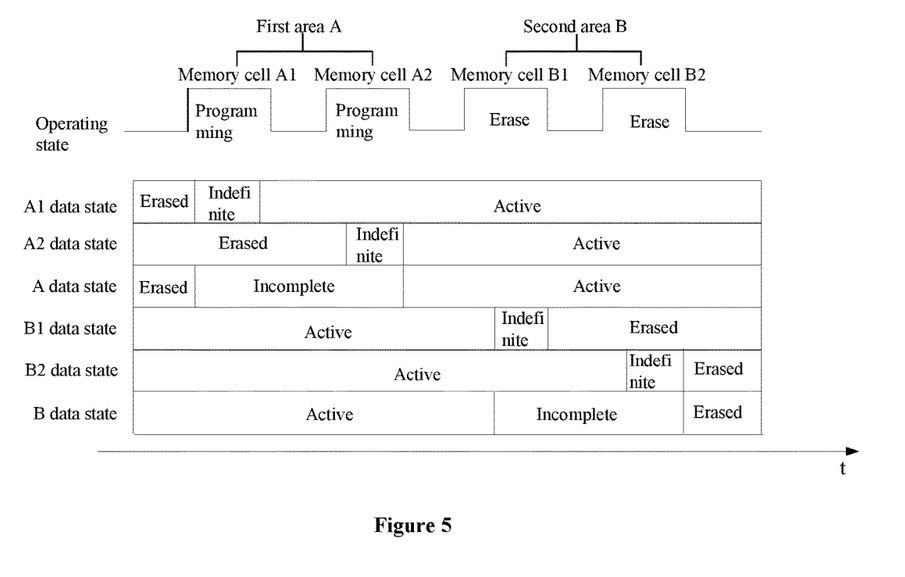
FIG. 5 illustrates a schematic diagram of writing data into a memory consistent with the disclosed embodiments.

For illustration purposes, Steps 43 and 44 are described herein using data to be stored 'X' with length of two pages as an example. Referring to FIG. 5, the memory may include a first area 'A' and a second area 'B'. The first area 'A' may include a memory cell 'A1' and a memory cell 'A2'. The second area 'B' may include a memory cell 'B1' and a memory cell 'B2'.

Before writing data into the memory, the data in the first area 'A' may be in the erased state. In other words, the data in the memory cell 'A1' and the memory cell 'A2' may be in the erased state. The data in the second area 'B' may be in the active state. In other words, the data in the memory cell 'B1' and the memory cell 'B2' may be in the active state.

The data to be stored 'X' may include data 'X1' and data 'X2'. The lengths of the data 'X1' and the data 'X2' may be one page, respectively. The write sequence may include first writing the data 'X1' into the memory, and then writing the data 'X2' into the memory. The target address of the data 'X1' may be the memory cell 'A1', and the target address of the data 'X2' may be the memory cell 'A2'.

Specifically, the programming operation may be performed on each memory cell in the selected area. In other words, the programming operation may be performed on each memory cell in the first area 'A'. The programming operation may be first performed on the memory cell 'A1' to write the data 'X1' into the memory cell 'A1', and then the programming operation may be performed on the memory cell 'A2' to write the data 'X2' into the memory cell 'A2'.

After performing the programming operation on the first area 'A', in other words, after all the data in the memory cell 'A1' and the memory cell 'A2' is in the active state, the erase operation may be performed on the second area 'B'. In other words, the erase operation may be sequentially performed on the memory cell 'B1' and the memory cell 'B2'. Therefore, the data state in the memory cell 'B1' and the memory cell 'B2' may be first changed from the active state to the indefinite state, and then from the indefinite state to the erased state. When writing the data into the memory next time, the data may be directly written into the second area 'B', and the erase operation may be performed on the first area 'A'.

As shown in FIG. 5, the data in at least one area of the first area 'A' and the second area 'B' may be in the active state at any time, therefore at least one complete data may be stored in the memory whenever the write operation is interrupted. Further, when the data to be stored is N pages in length, the programming operation and the erase operation may only need to be respectively performed N times during the writing process, the number of times of reading and writing of the memory may be reduced by one time.

Figure 7:
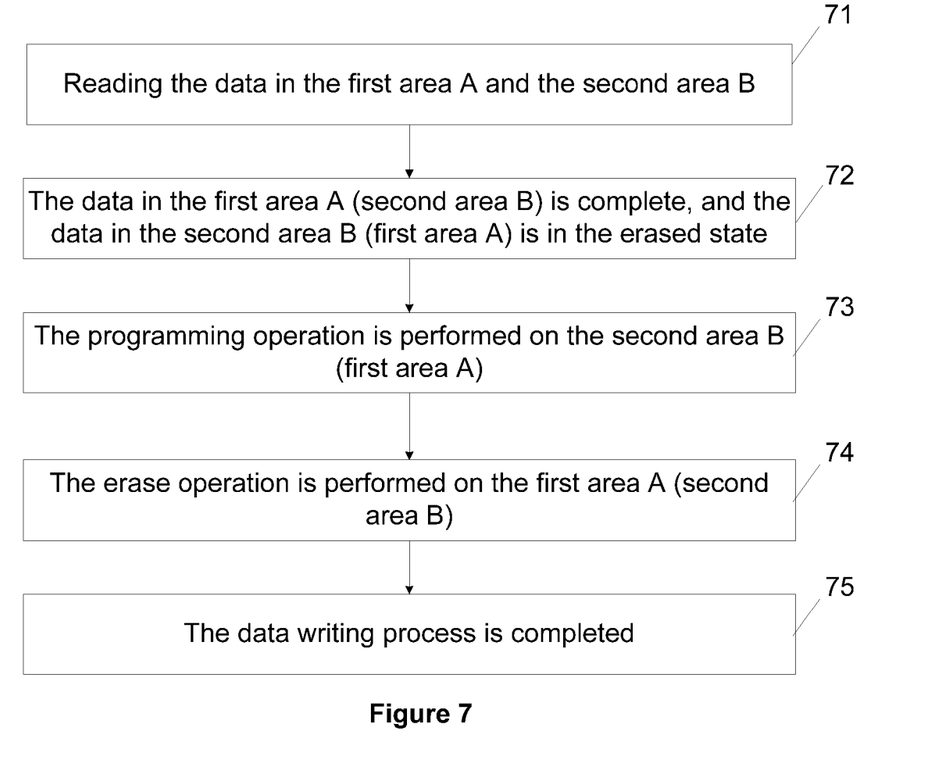
FIG. 7 illustrates a normal process of writing data into a memory consistent with the disclosed embodiments.

In one embodiment, referring to FIG. 7, the normal process of writing data into the memory may include reading the data in the first area 'A' and the second area 'B' (e.g., in Step 71). If the data in the first area 'A' (second area 'B') is complete and the data in the second area 'B' (first area 'A') is in the erased state (e.g., in Step 72), the programming operation may be first performed on the second area 'B' (first area 'A') (e.g., in Step 73). Then the erase operation may be performed on the first area A (second area B) (e.g., in Step 74), and the normal data writing process is completed (e.g., in Step 75).

Figure 8:
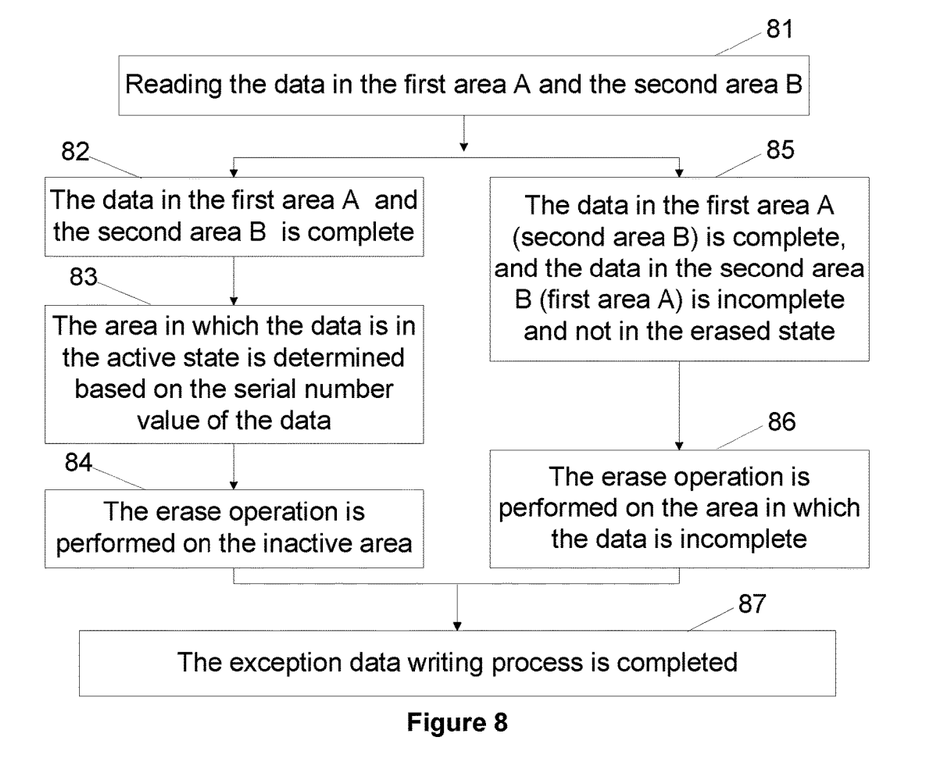
FIG. 8 illustrates an exception-handling process of writing data into a memory consistent with the disclosed embodiments.

Specifically, in one embodiment, the write operation may be interrupted after performing the Step 43 and before performing the Step 44 in FIG. 4. Referring to FIG. 8, in one embodiment, the exception-handling process of writing data into the memory may include reading the data in the first area 'A' and the second area 'B' (e.g., in Step 81). When writing data into the memory next time, all the data in the first area 'A' and the second area 'B' may be complete, that is in the active state (e.g., in Step 82). The identification information of the data in each area may be obtained, and the write sequence of the data in each area may be distinguished by the identification information. Then, according to the correspondence relationship between the preset write sequence of the data and the area state, the area in which the data is in the active state may be determined based on the serial number value of the data (e.g., in Step 83). Then, the erase process may be performed on the inactive area to write the data to be stored into the inactive area (e.g., in Step 84), and the exception data writing process is completed (e.g., in Step 87).

For example, when writing the data into the memory, the serial number value of the data to be stored may be sequentially increased. Therefore, when the data in the first area 'A' and the second area 'B' is in the active state, the data with the larger serial number value may be post-written data, and the data with the smaller serial number value may be pre-written data. Correspondingly, the area in which the data have the larger serial number value may correspond to the active area, and the area in which the data have the smaller serial number value may correspond to the inactive area. The erase operation may be performed on the area in which the data have the smaller serial number value to write the data to be stored into the inactive area.

Referring to FIG. 8, in another embodiment, during the exception data writing process, the data in the first area 'A' (second area 'B') may be complete, and the data in the second area 'B' (first area 'A') may be incomplete and not in the erased state (e.g., in Step 85). At this time, the erase operation may be performed on the area in which the data is incomplete (e.g., in Step 86) to complete the exception data writing process.

According to the method consistent with the described embodiments, when receiving the data to be stored, by selecting the area in which the data in the first area and the second area is in the erased state, the data to be stored may be written into the selected area. After writing the data to be stored into the selected area, the erase operation may be performed on the other remaining area. Therefore, there is at least one area in which the data is in the active state in the memory whenever the write operation is interrupted, to achieve secure data write. Under the premise of ensuring data security, when the data to be stored is N pages in length, the programming operation and the erase operation may only need to be respectively performed N times to complete the writing of all the data. Therefore, it may effectively reduce the number of times of erasing and writing, increase the service life of the memory, and improve the speed of writing data into the memory.

Figure 6:
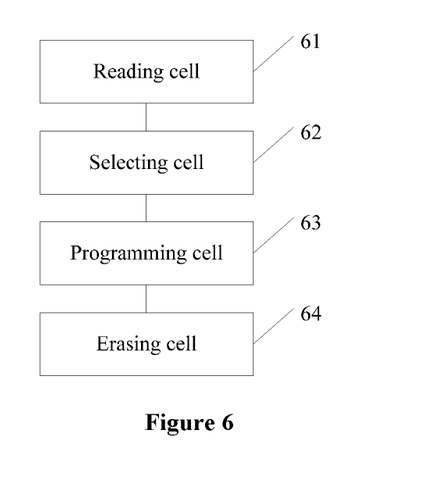
FIG. 6 illustrates an exemplary memory control apparatus consistent with the disclosed embodiments.

A memory control apparatus corresponding to the memory control method is also provided in the present disclosure. FIG. 6 illustrates an exemplary memory control apparatus consistent with the disclosed embodiments.

The memory may include a first area and a second area. The first area and the second area may have the same memory space, and each may include two or more memory cells. The data to be stored may occupy at least two memory cells. The data storage capacity of each memory cell may be one page. The memory space of the first area and the second area may be larger than or equal to the memory space occupied by the data to be stored.

Referring to FIG. 6, the control apparatus may include a reading cell 61, a selecting cell 62, a programming cell 63, and an erasing cell 64. The reading cell 61 may be configured to read the data in the first area and the second area of the memory when receiving the data to be stored. The selecting cell 62 may be configured to select an area in which the data in the first area and the second area is in an erased state. The programming cell 63 may be configured to perform a programming operation on each memory cell in the selected area to write the data to be stored into the selected area. The erasing cell 64 may be configured to perform an erase operation on the other remaining area to perform the next data writing after writing the data to be stored into the selected area.

In one embodiment, when the memory does not include an area in which the data is in the erased state and includes an area in which the data is in an indefinite state, the erasing cell 64 may be configured to perform the erase operation on the area in which the data is in the indefinite state to change the area in which the data is in the indefinite state to the area in which the data is in the erased state.

In one embodiment, the data to be stored read by the reading cell 61 may include data information, and identification information of the data. In one embodiment, the identification information may be in the form of a serial number, and the write sequence of the data to be stored may be identified based on the identification information. For example, when writing the data into the memory, the serial number value of the data to be stored may be sequentially increased. Therefore, the area in which the data have the larger serial number value may correspond to the active area, and the area in which the data have the smaller serial number value may correspond to the inactive area.

Correspondingly, the control apparatus may also include a second acquisition cell, a determination cell, and a fourth execution cell (not labeled). When the data in both the first area and the second area is in an active state, the second acquisition cell may be configured to obtain the identification information of the data in each area. The determination cell may be configured to determine whether the area corresponding to the data is active or inactive based on the identification information. The fourth execution cell may be configured to perform the erase operation on the inactive area.

In one embodiment, the data to be stored read by the reading cell 61 may also include verification information of the data. Correspondingly, the selecting cell 62 may also be configured to obtain the verification information of the data in the first area and the second area, and to select the area in which the data in the first area and the second area is in the erased state based on the verification information.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A memory control method, comprising:
providing a memory including a first area and a second area;
reading data in the first area and the second area when receiving data to be stored, a data state in each of the first area and the second area being one of an erase state, an indefinite state, and an active state, wherein an indefinite state is that the data in the memory cell is incomplete caused by an interruption of the erase operation performed on the memory cell or by an interruption of the programming operation performed on the memory cell;
selecting, from the first area and the second area, an area in which the data is in the erased state based on the data state in the first area and the second area after reading the data in the first area and the second area;
performing a programming operation on each memory cell in the selected area to write the data to be stored into the selected area; and
performing an erase operation on a remaining area in the first area and the second area to perform a next data writing process, after writing the data to be stored into the selected area.

2. The memory control method according to claim 1, further including:
when the memory does not include the area in which the data is in the erased state and includes an area in which the data is in an indefinite state,
performing the erase operation on the area in which the data is in the indefinite state to change the area in which the data is in the indefinite state to the area in which the data is in the erased state.

3. The memory control method according to claim 1, wherein:
the first area and the second area have a same memory space, and each includes two or more memory cells;
the data to be stored occupies at least two memory cells;
a data storage capacity of each memory cell is one page; and
the memory space of the first area and the second area is larger than or equal to a memory space occupied by the data to be stored.

4. The memory control method according to claim 1, wherein the data to be stored includes:
data information;
identification information of the data; and
verification information of the data.

5. The memory control method according to claim 4, further including:
obtaining the identification information of the data respectively in the first area and the second area, when the data in both the first area and the second area is in an active state;
determining whether the area, corresponding to the data, is active or inactive, based on the identification information; and
performing the erase operation on the inactive area.

6. The memory control method according to claim 5, wherein:
the identification information includes a serial number; and
a write sequence of the data to be stored is identified, based on the identification information.

7. The memory control method according to claim 6, wherein, when writing the data into the memory:
a value of the serial number of the data to be stored is sequentially increased.

8. The memory control method according to claim 7, wherein:
the area of the first area and the second area in which the data have a larger serial number value corresponds to the active area; and
the area of the first area and the second area in which the data have a smaller serial number value corresponds to the inactive area.

9. The memory control method according to claim 4, wherein selecting, from the first area and the second area, the area in which the data is in the erased state includes:
obtaining the verification information of the data in the first area and the second area; and
selecting, from the first area and the second area, the area in which the data is in the erased state, based on the verification information.

10. The memory control method according to claim 1, wherein:
the erased state is that the data in the memory cell have been erased, and new data can be directly written when the memory cell is in the erased state;
new data is unable to be directly written when the memory cell is in the indefinite state; and
an active state is that the data in the memory cell is complete, and the data in the memory cell is able to be directly read when the memory cell is in the active state.

11. A memory control method, comprising:
providing a memory including a first area and a second area;
reading data in the first area and the second area when receiving data to be stored, a data state in each of the first area and the second area being one of an erase state, an indefinite state, and an active state;
selecting, from the first area and the second area, an area in which the data is in the erased state based on the data state in the first area and the second area after reading the data in the first area and the second area;
performing a programming operation on each memory cell in the selected area to write the data to be stored into the selected area; and
performing an erase operation on a remaining area in the first area and the second area to perform a next data writing process, after writing the data to be stored into the selected area, wherein, during a data writing process:
the data in at least one area of the first area and the second area is in an active state at any time; and
at least one complete data is stored in the memory whenever the write operation is interrupted.

12. The memory control method according to claim 1, wherein, during a data writing process:
the data to be stored has N pages in length; and
the programming operation and the erase operation needs to be respectively performed N times during the writing process.

13. A memory control apparatus, comprising:
a memory including a first area and a second area;
a reading cell, configured to read data in the first area and the second area of the memory when receiving data to be stored, a data state in each of the first area and the second area being one of an erase state, an indefinite state, and an active state, wherein an indefinite state is that the data in the memory cell is incomplete caused by an interruption of the erase operation performed on the memory cell or by an interruption of the programming operation performed on the memory cell;
a selecting cell, configured to select, from the first area and the second area, an area in which the data is in the erased state based on the data state in the first area and the second area after reading the data in the first area and the second area;
a programming cell, configured to perform a programming operation on each memory cell in the selected area to write the data to be stored into the selected area; and
an erasing cell, configured to perform an erase operation on a remaining area to perform a next data writing process, after writing the data to be stored into the selected area.

14. The memory control apparatus according to claim 13, wherein:
the first area and the second area have a same memory space, and each includes two or more memory cells;
the data to be stored occupies at least two memory cells;
a data storage capacity of each memory cell is one page; and
the memory space of the first area and the second area is larger than or equal to a memory space occupied by the data to be stored.

15. The memory control apparatus according to claim 13, wherein:
when the memory does not include an area in which the data is in the erased state and includes an area in which the data is in an indefinite state,
the erasing cell is configured to perform the erase operation on the area in which the data is in the indefinite state to change the area in which the data is in the indefinite state to the area in which the data is in the erased state.

16. The memory control apparatus according to claim 13, wherein the data to be stored read by the reading cell includes:
    data information;
    identification information of the data; and
    verification information of the data.

17. The memory control apparatus according to claim 16, further including:
    a second acquisition cell configured to obtain the identification information of the data respectively in the first area and the second area, when the data in both the first area and the second area is in an active state;
    a determination cell configured to determine whether the area, corresponding to the data, is active or inactive, based on the identification information; and
    a fourth execution cell configured to perform the erase operation on the inactive area.

18. The memory control apparatus according to claim 16, wherein:
    the selecting cell is also configured to obtain the verification information of the data in the first area and the second area, and to select, from the first area and the second area, the area in which the data is in the erased state, based on the verification information.

19. The memory control apparatus according to claim 16, wherein:
    the identification information includes a serial number; and
    a value of the serial number of the data to be stored is sequentially increased when writing the data into the memory.

20. The memory control apparatus according to claim 19, wherein:
    the area of the first area and the second area in which the data have a larger serial number value corresponds to an active area; and
    the area of the first area and the second area in which the data have a smaller serial number value corresponds to an inactive area.

* * * * *